(12) United States Patent
Wang

(10) Patent No.: US 12,040,296 B2
(45) Date of Patent: Jul. 16, 2024

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 251 days.

(21) Appl. No.: 17/826,222

(22) Filed: May 27, 2022

(65) Prior Publication Data
US 2023/0223367 A1    Jul. 13, 2023

Related U.S. Application Data

(63) Continuation of application No. PCT/CN2022/078109, filed on Feb. 25, 2022.

(30) Foreign Application Priority Data

Jan. 12, 2022  (CN) .......................... 202210033870.3

(51) Int. Cl.
*H01L 23/00*      (2006.01)

(52) U.S. Cl.
CPC .............. *H01L 24/13* (2013.01); *H01L 24/81* (2013.01); *H01L 2224/1308* (2013.01);
(Continued)

(58) Field of Classification Search
CPC . H01L 24/13; H01L 24/81; H01L 2224/1308; H01L 2224/13111;
(Continued)

(56) References Cited

U.S. PATENT DOCUMENTS 9,129,963 B1 *   9/2015   Yang ..................... H01L 23/481
10,319,693 B2    6/2019   Lambert
(Continued)

FOREIGN PATENT DOCUMENTS

CN            1708840 A       12/2005
CN          105097777 A       11/2015
(Continued)

*Primary Examiner* — Karen Kusumakar
*Assistant Examiner* — Shawn Shaw Muslim
(74) *Attorney, Agent, or Firm* — Kilpatrick Townsend & Stockton LLP

(57) ABSTRACT

A semiconductor structure and a method for same are provided. The semiconductor structure includes: a first base having a first face, a second base having a second face, and a welding structure. The first base has an electrical connection column protruding from the first face. A first groove is provided at top of the electrical connection column. A conductive column is provided in the second base, and the second base also has a second groove. A top face and at least portion of a side face of the conductive column are exposed by the second groove. The electrical connection column is partially located in the second groove, and the conductive column is partially located in the first groove. At least portion of the welding structure is filled in the second groove, and at least further portion of the welding structure is filled between the conductive column and first groove.

18 Claims, 13 Drawing Sheets

(52) U.S. Cl.
CPC ............... *H01L 2224/13111* (2013.01); *H01L 2224/13124* (2013.01); *H01L 2224/13139* (2013.01); *H01L 2224/13147* (2013.01); *H01L 2224/13166* (2013.01); *H01L 2224/13181* (2013.01); *H01L 2224/81815* (2013.01); *H01L 2924/01013* (2013.01); *H01L 2924/01022* (2013.01); *H01L 2924/01029* (2013.01); *H01L 2924/01047* (2013.01); *H01L 2924/0105* (2013.01); *H01L 2924/01073* (2013.01); *H01L 2924/04941* (2013.01); *H01L 2924/04953* (2013.01)

(58) Field of Classification Search
CPC . H01L 2224/13124; H01L 2224/13139; H01L 2224/13147; H01L 2224/13166; H01L 2224/13181; H01L 2224/81815; H01L 2924/01013; H01L 2924/01022; H01L 2924/01029; H01L 2924/01047; H01L 2924/0105; H01L 2924/01073; H01L 2924/04941; H01L 2924/04953; H01L 24/03; H01L 24/05; H01L 24/11; H01L 24/16
See application file for complete search history.

(56) References Cited

U.S. PATENT DOCUMENTS

| | | |
|---|---|---|
| 2006/0121690 A1 | 6/2006 | Pogge et al. |
| 2011/0149540 A1* | 6/2011 | Brun .................. H01L 25/50 361/783 |
| 2012/0074555 A1* | 3/2012 | Snyder ................ H01L 24/32 257/E23.005 |
| 2013/0292823 A1 | 11/2013 | Chapelon |
| 2015/0054140 A1 | 2/2015 | Chapelon |
| 2015/0287687 A1 | 10/2015 | Farrens et al. |
| 2015/0364441 A1 | 12/2015 | Lambert |
| 2017/0011948 A1 | 1/2017 | Farrens et al. |
| 2017/0186724 A1* | 6/2017 | Chylak .................. H01L 24/17 |
| 2020/0243467 A1 | 7/2020 | Prevatte et al. |
| 2021/0217703 A1 | 7/2021 | Chuang et al. |
| 2022/0189822 A1 | 6/2022 | Wang et al. |

FOREIGN PATENT DOCUMENTS

| | | | | |
|---|---|---|---|---|
| CN | 108573883 A | | 9/2018 | |
| CN | 111081646 A | | 4/2020 | |
| CN | 111199946 A | | 5/2020 | |
| CN | 111326503 A | | 6/2020 | |
| CN | 111785646 A | | 10/2020 | |
| CN | 112117249 A | | 12/2020 | |
| CN | 112456436 A | * 3/2021 | ............ B81C 3/001 |
| CN | 112456436 A | | 3/2021 | |
| CN | 112614807 A | | 4/2021 | |
| CN | 112670191 A | | 4/2021 | |
| CN | 112670249 A | | 4/2021 | |
| CN | 112802757 A | | 5/2021 | |
| JP | 2014143305 A | | 8/2014 | |

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This application is a U.S. continuation application of International Application No. PCT/CN2022/078109, filed Feb. 25, 2022, which claims priority to Chinese Patent Application No. 202210033870.3, filed Jan. 12, 2022. International Application No. PCT/CN2022/078109 and Chinese Patent Application No. 202210033870.3 are incorporated herein by reference in their entireties.

BACKGROUND

With the development of a three-dimensional packaging technology, a multi-layer stack packaging technology is widely used, but a multi-layer stack structure needs to use wafers with the same size for stacking. A connection structure between wafers will occupy a certain thickness of the multi-layer stack structure, which will increase the overall thickness of the multi-layer stack structure and does not meet the requirements of thinning terminals.

In addition, with the continuous reduction of integration, the size of the connection structure in the multi-layer stack structure becomes smaller, and the distance between adjacent connection structures becomes smaller, which tends to cause short-circuiting between adjacent connection structures and wafer-to-wafer separation.

SUMMARY

Embodiments of the disclosure relate to the field of semiconductors, and more particularly, to a semiconductor structure and a method for manufacturing a semiconductor structure.

According to some embodiments of the disclosure, an aspect of the embodiments of the disclosure provides a semiconductor structure, including: a first base having a first face, a second base having a second face, and a welding structure. The first base has an electrical connection column protruding from the first face. A first groove is provided at the top of the electrical connection column. A conductive column is provided in the second base, and the second base also has a second groove. A top face and at least a portion of a side face of the conductive column are exposed by the second groove. The second face is bonded to the first face. The electrical connection column is partially located in the second groove, and the conductive column is partially located in the first groove. At least a portion of the welding structure is filled in the second groove, and at least a further portion of the welding structure is filled between the conductive column and the first groove.

According to some embodiments of the disclosure, another aspect of the embodiments of the disclosure also provides a method for manufacturing a semiconductor structure, including the following operations. A first base having a first face is provided. The first base has an electrical connection column protruding from the first face. A second base having a second face is provided. A conductive column is provided in the second base, and the second base also has a second groove. A top face and at least a portion of a side face of the conductive column are exposed by the second groove. The second face is bonded to the first face. The electrical connection column is partially located in the second groove, the conductive column is partially located in the first groove, and at least a portion of the conductive column overlaps a portion of the electrical connection column in a staggered manner. A welding structure is formed. At least a portion of the welding structure is filled in the second groove, and at least a further portion of the welding structure is filled between the conductive column and the first groove.

BRIEF DESCRIPTION OF THE DRAWINGS

One or more embodiments are exemplified by the pictures corresponding thereto in the drawings, and the exemplary descriptions do not constitute a limitation to the embodiments. Unless otherwise stated, the figures in the drawings do not constitute a scale limitation.

DETAILED DESCRIPTION

Figure 1:
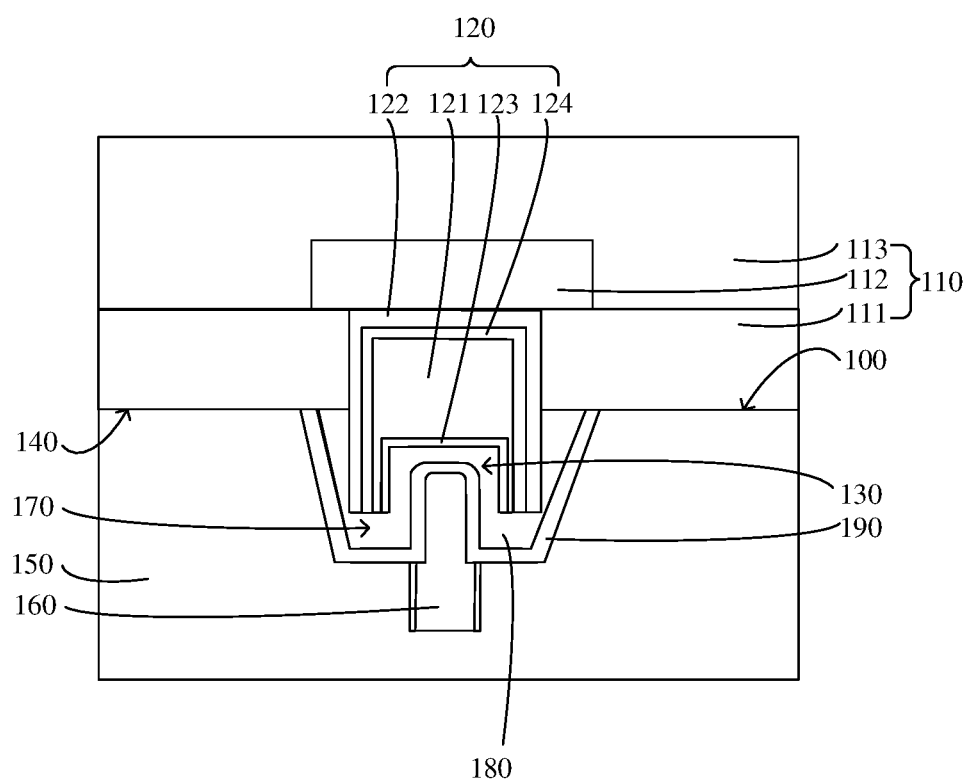
FIG. 1 is a schematic structure diagram of a semiconductor structure according to an embodiment of the disclosure.

It can be seen from the background art that with the continuous reduction of integration, the size of the connection structure in the multi-layer stack structure becomes smaller, and the distance between adjacent connection structures becomes smaller. However, the small distance between connection structures may result in the occurrence of lapping between adjacent connection structures, resulting in the occurrence of short-circuiting between adjacent connection structures.

Through analysis, it is found that in the current stacked base packaging technology, a Thermo Compression Bonding (TCB)-Non Conduction Adhesive Film (NCF) thermo compression bonding process is usually used. A TCB forms welding at a connection structure between two adjacent bases by heating and pressurizing so as to realize the connection between the adjacent bases. An NCF works in conjunction with the TCB process. That is, by applying the NCF between two bases, the NCF serves as a filler material to fill a gap between the two bases and to encapsulate a connection structure protruding from the bases.

However, due to the special fluidity of the NCF material, the manufacturing process with sufficient strength cannot be provided to the connection structure, and the shape of the connection structure tends to shift under stress, so that the connection structure between adjacent bases is unstable. Moreover, the shape of the connection structure tends to shift under stress, so that the shape of the connection structure is easily abnormal, which may result in the dislocation of joints between the bases and thus reduce the signal transmission efficiency between adjacent bases, and may also result in short-circuiting caused by the contact of adjacent connection structures. In addition, due to the addition of the NCF material between the bases, the overall thickness of the stacked bases is increased, which does not meet the current requirements of thinning terminals.

Embodiments of the disclosure provide a semiconductor structure. By arranging an electrical connection column in a second groove and a conductive column in a first groove, the tightness of connection between a first base and a second base can be improved and the whole height of the semiconductor structure can be reduced. By arranging the welding structure in the first groove and the second groove, the interconnection of adjacent electrical connection columns or conductive columns due to the flow of the welding structure during bonding can be avoided. The reliability of the semiconductor structure can be improved by arranging the welding structure in the first groove and the second groove. Moreover, by reducing the use of NCF materials, the consumption of materials can be reduced and the whole height of the semiconductor structure can be reduced, and the occurrence of short-circuiting caused by the contact of adjacent connection structures due to the use of the NCF materials can also be avoided.

The various embodiments of the disclosure are described in detail below in combination with the drawings. However, it will be appreciated by those of ordinary skill in the art that in the various embodiments of the disclosure, numerous technical details are set forth in order for the reader to have a better understanding of the embodiments of the disclosure. However, the claimed technical solutions of the embodiments of the disclosure can be realized without these technical details and various changes and modifications based on the following various embodiments.

FIG. 1 is a schematic structure diagram of a semiconductor structure according to an embodiment of the disclosure.

Referring to FIG. 1, the semiconductor structure includes: a first base 110 having a first face 100, a second base 150 having a second face 140, and a welding structure 180. The first base 110 has an electrical connection column 120 protruding from the first face 100. A first groove 130 is provided at the top of the electrical connection column 120. A conductive column 160 is provided in the second base 150, and the second base 150 also has a second groove 170. A top face and at least a portion of a side face of the conductive column 160 are exposed by the second groove 170. The second face 140 is bonded to the first face 100. The electrical connection column 120 is partially located in the second groove 170, and the conductive column 160 is partially located in the first groove 130. At least a portion of the welding structure 180 is filled in the second groove 170, and at least a further portion of the welding structure 180 is filled between the conductive column 160 and the first groove 130.

In some embodiments, the first base 110 and the second base 150 may both be a wafer and the semiconductor structure may be a wafer stack structure. In other embodiments, the first base 110 and the second base 150 may also both be a die and the semiconductor structure may be a die stack structure. Further, in still other embodiments, one of the first base 110 and the second base 150 may be a wafer and the other may be a die.

Specifically, in some embodiments, the first base 110 may include: a passivation layer 111, a conductive layer 112 and a substrate 113.

In some embodiments, the passivation layer 111 covers a surface of the substrate 113 facing the passivation layer 111, and the passivation layer 111 also covers a portion of a surface of the conductive layer 112. The passivation layer 111 is used for protecting the conductive layer 112 and the substrate 113 to prevent the conductive layer 112 and the substrate 113 from contacting with other structures, improving the stability of the semiconductor structure. The conductive layer 112 is located in the substrate 113, and the surface of the conductive layer 112 is exposed from the substrate 113. The conductive layer 112 is used for electrically connecting the electrical connection column 120 and other structures in the first base 110.

In some embodiments, the material of the passivation layer 111 may be an insulating material with a high relative dielectric constant such as silicon nitride, silicon nitride or silicon oxynitride, and the material of the conductive layer 112 may be a conductive material such as aluminum, silver or gold. The material type of the substrate 113 may be an element semiconductor material or a crystalline inorganic compound semiconductor material. The element semiconductor material may be silicon or germanium. The crystalline inorganic compound semiconductor material may be silicon carbide, silicon germanide, gallium arsenide, indium gallium, etc.

In some embodiments, the electrical connection column 120 is located on the surface of the conductive layer 112 and is electrically connected to the conductive layer 112. Electrical signals of the conductive layer 112 are led out through the electrical connection column 120. In other embodiments, a portion of the electrical connection column 120 may also be embedded in the conductive layer 112. In yet other embodiments, the electrical connection column may also penetrate through the conductive layer and be electrically connected to the conductive layer through sidewalls of the electrical connection column.

By arranging the electrical connection column 120 in the second groove 170 and arranging the conductive column 160 in the first groove 130, the height of the semiconductor structure can be reduced. The welding structure 180 can be limited by arranging the welding structure 180 in the first groove 130 and the second groove 170, so as to prevent the welding structure 180 from flowing and thus causing lapping between adjacent electrical connection columns 120 or adjacent conductive columns 160, thereby reducing the possibility of short-circuiting the semiconductor structure. By filling the welding structure 180 around the electrical connection column 120, the first base 110 and the second base 150 can be connected more tightly, thereby improving the connection tightness of the semiconductor structure. During the process of bonding the first base 110 to the second base 150, the conductive column 160 and the electrical connection column 120 are thermally expanded, and the interaction force generated by the expansion achieves a tight connection of the semiconductor structure.

In some embodiments, a cross-section of a portion of the conductive column 160 exposed by the second groove 170 may be smaller than a cross-section of a portion not exposed by the second groove 170 in a plane parallel to the second face 140.

By adjusting the width of the portion of the conductive column 160 exposed by the second groove 170, the electrical connection column 120 can be embedded in the second groove 170, and a space is also reserved for the thermal expansion of the portions of the conductive column 160 and the electrical connection column 120 when bonding the first base 110 to the second base 150, thereby avoiding direct contact between the conductive column 160 and the electrical connection column 120, avoiding mutual extrusion between the conductive column 160 and the electrical connection column 120 due to thermal expansion of the conductive column 160 and the electrical connection column 120 during the bonding process. By reserving a space for the thermal expansion of the portions of the conductive column 160 and the electrical connection column 120, the internal stress exerted to the conductive column 160 and the electrical connection column 120 can be reduced. By reserving the space for thermal expansion between the conductive column 160 and the electrical connection column 120, the conductive column 160 and the electrical connection column 120 can be connected more tightly after thermal expansion. Accordingly, the space volume of the second groove 170 can be increased, so that more welding structures 180 can be accommodated, thereby improving the tightness of connection between the first base 110 and the second base 150.

In some embodiments, the electrical connection column 120 may include: a conductive body 121, a first diffusion barrier layer 122 located on a bottom face and side faces of the conductive body 121, and a first metal protective layer 123 located on sidewalls and a bottom face of the first groove 130. The conductive body 121 is partially located in the second groove 170.

In some embodiments, the conductive body 121 may be used to realize signal transmission between the first base 110 and the second base 150.

The first diffusion barrier layer 122 may be higher than the conductive body 121, and the first diffusion barrier layer 122 may prevent a portion of ions of copper metal of the conductive body 121 from entering the first base 110 when the ions are diffused, and thus prevent the conductive body 121 from contaminating the first base 110, thereby improving the performance of the whole semiconductor structure. The first metal protective layer 123 is located on the surface of the conductive body 121 facing the second groove 170, and the first metal protective layer 123 may also cover inner walls of a portion of the first diffusion barrier layer 122 higher than the conductive body 121. The first metal protective layer 123 is used for protecting the conductive body 121 from being in contact with the air, preventing a portion of the conductive body 121 from reacting with the air, thereby preventing a portion of the conductive body 121 from being oxidized. The conductive body 121 can be separated from the air by the first metal protective layer 123. Thus, oxidation or water vapor corrosion of the conductive body 121 is avoided. The first metal protective layer 123 may also be used for preventing the conductive body 121 from contaminating the second base 150 during ion diffusion.

In some embodiments, the electrical connection column 120 further includes: a first electroplating seed layer 124. The first electroplating seed layer 124 is located between the conductive body 121 and the first diffusion barrier layer 122.

In some embodiments, a portion of the first electroplating seed layer 124 may be higher than the surface of the conductive body 121, and a top face of the first electroplating seed layer 124 may be flush with a top face of the first diffusion barrier layer 122. In other embodiments, the top face of the first electroplating seed layer 124 may also be flush with the top face of the conductive body 121. A corresponding height of the top face of the first electroplating seed layer 124 may be selected as desired.

The material of the first electroplating seed layer 124 may be copper or aluminum, and the material of the first electroplating seed layer 124 may be the same as the material of the conductive body 121. The formation of the conductive body 121 can be advantageously guided by forming the first electroplating seed layer 124, and the adhesion of the conductive body 121 to the first diffusion barrier layer 122 can be improved by the first electroplating seed layer 124, thereby improving the stability of connection between the conductive body 121 and the first diffusion barrier layer 122. The void defect inside the conductive body 121 can also be reduced by the first electroplating seed layer 124, thereby improving the effect of the first diffusion barrier layer 122 for preventing ion diffusion of the conductive body 121.

The material of the conductive body 121 may include copper or aluminum, and the material of the first diffusion barrier layer 122 may include tantalum, titanium, titanium nitride, or tantalum nitride.

It will be appreciated that copper and aluminum materials have a better conductivity, and the materials have a lower price, which is beneficial to reducing the cost of the semiconductor structure while ensuring good conductivity. In an example where the material of the first diffusion barrier layer 122 is titanium nitride, by forming a titanium nitride layer on the surface of the conductive body 121, grain boundaries and various defects of a portion of the conductive body 121 can be filled, thereby blocking a rapid diffusion path of atoms. In some embodiments, a stacked structure of a titanium nitride layer and a tantalum layer may also be formed as the first diffusion barrier layer 122. The barrier property of the first diffusion barrier layer 122 can be improved by the stacked structure of the titanium nitride layer and the tantalum layer.

In some embodiments, a depth ratio of the first groove 130 to the second groove 170 in a direction perpendicular to the first face 100 or perpendicular to the second face 140 is within a range of 1:1 to 1:5. For example, the depth ratio is 1:2, 1:3.2, or 1:4, etc.

It will be appreciated that the depth ratio of the first groove 130 to the second groove 170 may be adjusted according to actual requirements. A depth sum of the first groove 130 and the second groove 170 needs to satisfy that the welding structure 180 fills up the first groove 130 and the second groove 170 after bonding the first base 110 to the second base 150. On the premise of satisfying that the welding structure 180 fills up the first groove 130 and the second groove 170, as the depth of the second groove 170 is larger, the contact area between the electrical connection column 120 and the conductive column 160 is larger accordingly. As the contact area is larger, the heat dissipation effect of the semiconductor structure is better. When the depth ratio of the first groove 130 to the second groove 170 is less than 1:10, it may occur that the welding structure 180 cannot fill up the whole first groove 130 and second groove 170, resulting in poor stability of the semiconductor structure.

In some embodiments, the welding structure 180 is also located between the electrical connection column 120 and the sidewalls of the second groove 170.

It will be appreciated that as the first base 110 and the second base 150 are bonded, the welding structure 180 becomes molten and is pressed by the conductive column 160, so that the welding structure 180 in the molten state is displaced away from the conductive column 160. As the surfaces of the first face 100 and the second face 140 are attached, the welding structure 180 fills up the remaining spaces of the first groove 130 and the second groove 170 under the action of gravity and the pressing of the conductive column 160. The tightness of connection between the first base 110 and the second base 150 can be improved by the welding structure 180.

In some embodiments, the material of the welding structure 180 may include tin or tin-silver alloy, etc.

It will be appreciated that the tin or the tin-silver alloy has a relatively low melting point and a relatively high condensation point. The speed at which the welding structure 180 changes into a liquid state and the speed at which the welding structure changes from a liquid state to a solid state during the process of bonding the first base 110 to the second base 150 are relatively high, so that the time of the whole manufacturing process of the semiconductor structure can be shortened. The tin or the tin-silver alloy has a better affinity with metals such as copper, so that the welding structure 180 can be more tightly connected to the electrical connection column 120 and the conductive column 160 with a better connection effect. The tin or the tin-silver alloy also has a good electrical conductivity, thereby facilitating electrical signal transmission of the electrical connection column 120 and the conductive column 160. The tin or the tin-silver alloy has a good fluidity after heating, and also facilitates bonding of the electrical connection column 120 and the conductive column 160.

In some embodiments, the semiconductor structure may further include: a second diffusion barrier layer 190. The second diffusion barrier layer 190 is located on a bottom face and sidewalls of the second groove 170, and also located on a top face and side faces of the conductive column 160 exposed by the second groove 170.

By arranging the second diffusion barrier layer 190, it is possible to prevent a portion of ions of the material of the conductive column 160 from entering the first base 110 when the ions are diffused, thereby reducing the possibility of contaminating the first base 110, and thus improving the performance of the semiconductor structure. By arranging the second diffusion barrier layer 190, it is possible to fill grain boundaries and various defects of a portion of the conductive column 160, thereby blocking a fast diffusion path of atoms.

In some embodiments, the second diffusion barrier layer 190 may be of the same material as the first diffusion barrier layer 122, such as tantalum, titanium, titanium nitride, or tantalum nitride, thereby reducing the material type of producing the semiconductor structure and facilitating management and control of the whole production process.

In some embodiments, the width of the second groove 170 is 2 to 3 times the width of a portion of the conductive column 160 not exposed by the second groove 170 in a direction parallel to the second face 140. The width sum of the first groove 130 and the second groove 170 is set to be 2 to 3 times the width of the conductive column 160, thereby facilitating filling of the unoccupied space in the first groove 130 and the second groove 170 by the conductive column 160 and the electrical connection column 120. It will be appreciated that a width ratio of the first groove 130 and the second groove 170 to the conductive column 160 can be adjusted accordingly according to the total volume of the conductive column 160 and the electrical connection column 120 to be accommodated in the first groove 130 and the second groove 170.

In the embodiments of the disclosure, the electrical connection column 120 is arranged in the second groove 170, the conductive column 160 is arranged in the first groove 130, and the conductive column 160 and the electrical connection column 120 are thermally expanded during the bonding of the first base 110 and the second base 150, so that the conductive column 160 and the electrical connection column 120 are engaged with each other, thereby improving the tightness of connection between the first base 110 and the second base 150. By arranging the welding structure 180 in the first groove 130 and the second groove 170, it is possible to reduce the probability of short-circuiting of the semiconductor structure caused by adjacent electrical connection columns 120 or adjacent conductive columns 160 that are electrically connected due to the flow of the welding structure 180. The whole height of the semiconductor structure can be reduced by arranging the portion of the electrical connection column 120 higher than the first base 110 in the second groove 170. Also the electrical connection column 120 and the conductive column 160 may overlap in a staggered manner, thereby improving the stability of bonding between the first base 110 and the second base 150. By arranging the portion of the electrical connection column 120 higher than the first base 110 in the second groove 170 and achieving the electrical connection between the electrical connection column 120 and the conductive column 160 by the welding structure 180, the contact area between the electrical connection column 120 and the conductive column 160 can be increased, which is beneficial to reducing the contact resistance between the electrical connection column 120 and the conductive column 160, and also beneficial to improving the heat dissipation of the semiconductor structure. By arranging the portion of the electrical connection column 120 higher than the first base 110 in the second groove 170, it is also possible to reduce the probability of short-circuiting of the semiconductor structure caused by adjacent electrical connection columns 120 or adjacent conductive columns 160 that are electrically connected, thereby improving the performance of the semiconductor structure.

Accordingly, an embodiment of the disclosure also provides a method for manufacturing a semiconductor structure. The method may be used for manufacturing the above semiconductor structure. The embodiment of FIG. 1 may be referred to for the same or corresponding parts. Detailed descriptions will be omitted below. A semiconductor structure provided by another embodiment of the disclosure will be described in detail below with reference to the drawings. FIGS. 2 to 13 are schematic structure diagrams corresponding to steps of a method for manufacturing a semiconductor structure according to an embodiment of the disclosure.

Referring to FIGS. 2 to 9, a first base 110 having a first face 100 is provided. The first base 110 has an electrical connection column 120 protruding from the first face 100.

In some embodiments, the method for forming the electrical connection column 120 may include the following operations. A first diffusion barrier layer 122 is formed. A conductive body 121 is formed, in which the conductive body 121 is located on a top face of the first diffusion barrier layer 122 and sidewalls of the first diffusion barrier layer 122. A first metal protective layer 123 is formed, in which the first metal protective layer 123 is located between the welding structure in the second groove 170 and the conductive body 121.

In some embodiments, the thickness of the first diffusion barrier layer 122 may be between 10 nm and 200 nm. It will be appreciated that when the thickness of the first diffusion barrier layer 122 is less than 10 nm, the effect of blocking ion diffusion of the copper metal of the conductive body 121 is not good. When the thickness of the first diffusion barrier layer 122 is greater than 200 nm, the resistance of the first diffusion barrier layer 122 may be too high, thereby affecting the performance of the whole semiconductor structure.

The corresponding thickness of the first diffusion barrier layer 122 may be selected according to practical requirements.

The first diffusion barrier layer 122 may prevent from affecting the performance of the whole semiconductor structure due to contamination of the first base 110 caused by the fact that some ions of the copper metal of the conductive body 121 enter the first base 110 when the ions are diffused. The first metal protective layer 123 is used for protecting the conductive body 121 from being in contact with the air, and thus preventing a portion of the conductive body 121 from being oxidized due to reaction of a portion of the conductive body 121 with the air. The conductive body 121 can be separated from the air by the first metal protective layer 123. Thus, oxidation or water vapor corrosion of the conductive body 121 is avoided. The first metal protective layer 123 may also be used for preventing the conductive body 121 from contaminating the second base 150 during ion diffusion.

Figure 2:
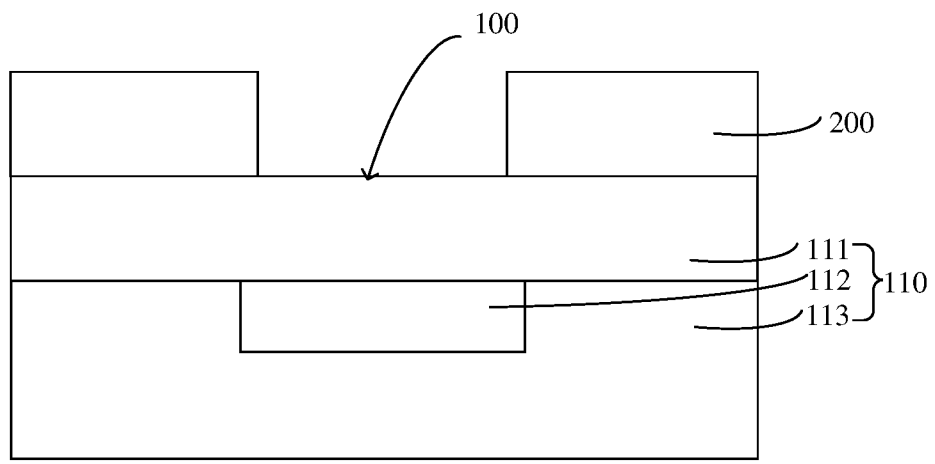
FIGS. 2 to 13 are schematic structure diagrams corresponding to steps of a method for manufacturing a semiconductor structure according to an embodiment of the disclosure.
Figure 3:
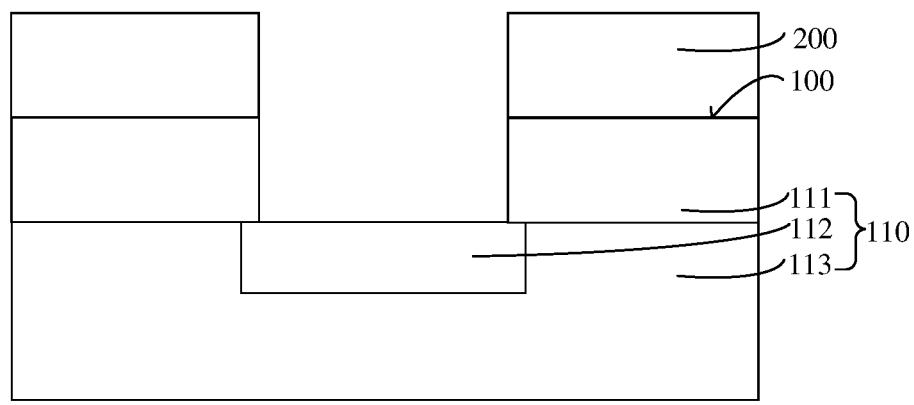

In some embodiments, before the first diffusion barrier layer 122 is formed, the method may further include the following operations. Referring to FIG. 2, a mask layer 200 having a first pattern is formed on the surface of the first face 100 of the first base 110. Referring to FIG. 3, a passivation layer 111 of the first base 110 is etched with the mask layer 200 as a mask to form a groove.

In some embodiments, the first base 110 includes a substrate 113, a passivation layer 111 and a conductive layer 112. A top face of the conductive layer 112 is exposed by the groove of the passivation layer 111. In other embodiments, a portion of the conductive layer 112 is also etched while etching the passivation layer 111. That is, the groove is also partially located in the conductive layer 112. In still other embodiments, the groove may also penetrate through the conductive layer.

In some embodiments, the passivation layer 111 may be etched by dry etching. For example, plasma is guided to accelerate by an electric field to energize the plasma, and the plasma is guided to bombard the passivation layer 111 so as to form a groove.

Figure 4:
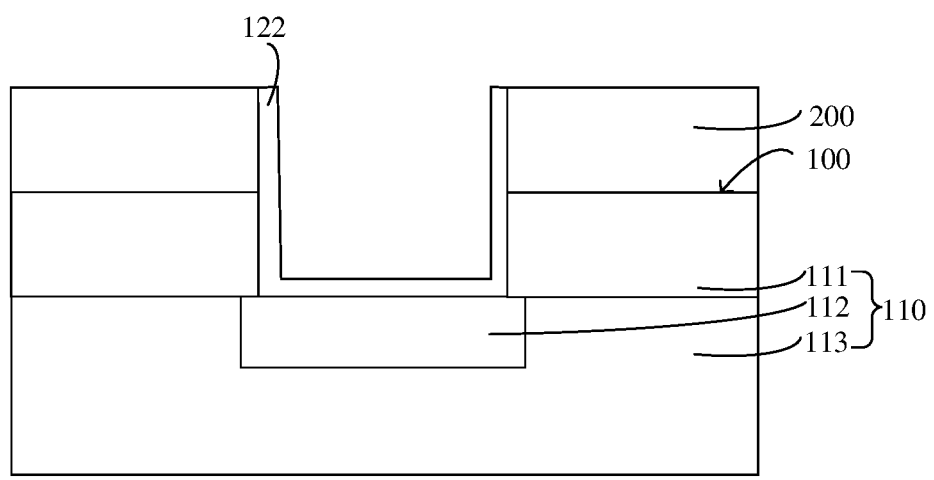

Referring to FIG. 4, a first diffusion barrier layer 122 is formed on inner walls and the bottom face of the groove.

In some embodiments, the first diffusion barrier layer 122 may be formed by means of Physical Vapor Deposition (PVD).

The process step of forming the first diffusion barrier layer 122 may include the following operations. An initial barrier layer is formed on the surface of the mask layer 200 and the inner walls and bottom face of the groove. A pattern layer is formed, in which the pattern layer exposes the initial barrier layer located on the surface of the mask layer 200. The initial barrier layer located on the surface of the mask layer 200 is removed by etching with the pattern layer as a mask, and the remaining initial barrier layer serves as the first diffusion barrier layer 122. The pattern layer is removed.

Figure 5:
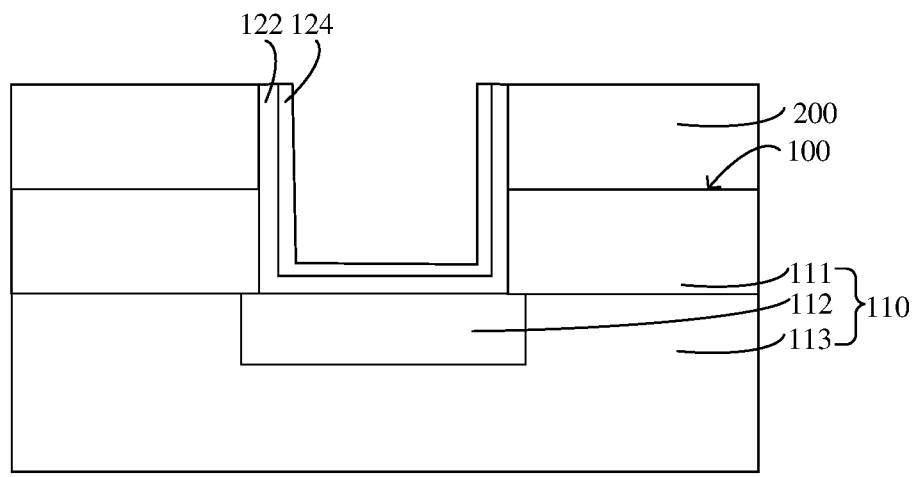

Referring to FIG. 5, before the conductive body 121 is formed, the method may further include the following operation. A first electroplating seed layer 124 is formed, in which the first electroplating seed layer 124 is located between the conductive body 121 and the first diffusion barrier layer 122.

In some embodiments, the first electroplating seed layer 124 is formed using a PVD process.

In some embodiments, the thickness of the first electroplating seed layer 124 may be 50 nm to 100 nm.

The material of the first electroplating seed layer 124 may be the same as the material of the conductive body 121. The formation of the conductive body 121 can be promoted by firstly forming the first electroplating seed layer 124. The void defect inside the subsequently formed conductive body 121 can also be reduced by the first electroplating seed layer 124, so as to improve the effect of the first diffusion barrier layer 122 for preventing the ion diffusion of the conductive body 121, thereby improving the performance of the semiconductor structure. Moreover, the adhesion of the conductive body 121 to the first diffusion barrier layer 122 can also be improved by the first electroplating seed layer 124, thereby improving the stability of connection of the conductive body 121 with the first diffusion barrier layer 122.

Figure 6:
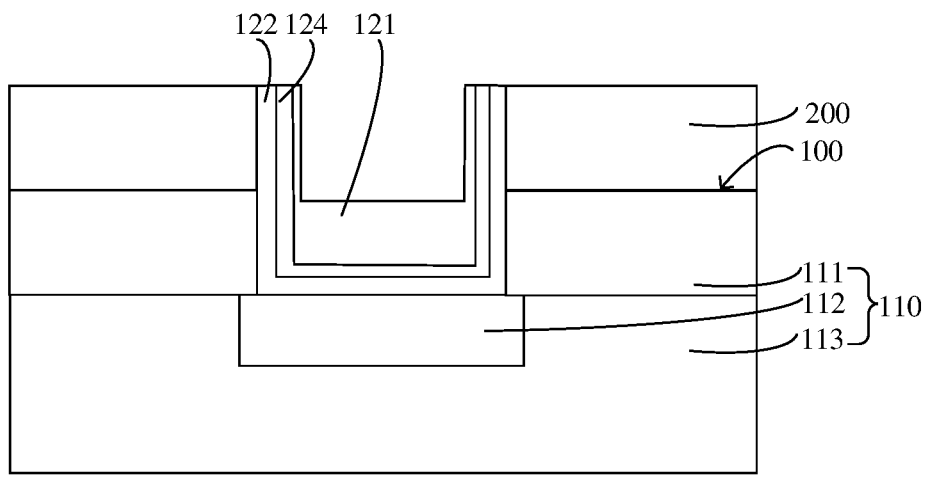

Referring to FIG. 6, a conductive body 121 filling the groove is formed on the first diffusion barrier layer 122, in which a groove is provided at the top of the conductive body 121.

In some embodiments, an electroplating process may be used to form the conductive body 121 on the surface of the first electroplating seed layer 124.

In some embodiments, a portion of the conductive body 121 is lower than the passivation layer 111. A thickness difference between the portion of the conductive body 121 lower than the passivation layer 111 and the passivation layer 111 may be between $1/10$ and $1/5$ times the thickness of the mask layer 220.

It will be appreciated that it is possible to provide a process basis for subsequently embedding the electrical connection column 120 into the second base 150 by setting a portion of the conductive body 121 to be lower than the passivation layer 111. In the case where the thickness difference between the portion of the conductive body 121 lower than the passivation layer 111 and the passivation layer 111 is less than $1/10$ of the thickness of the mask layer 220, when a first metal protective layer is subsequently formed, the first metal protective layer located on the top face of the portion of the conductive body 121 lower than the passivation layer 111 may be higher than the passivation layer 111, which is not conducive to the embedding processing between the electrical connection column 120 and the second base 150. In the case where the thickness difference between the portion of the conductive body 121 lower than the passivation layer 111 and the passivation layer 111 is more than $1/5$ of the thickness of the mask layer 220, the portion of the conductive body 121 lower than the passivation layer 111 is thinner, thereby reducing the conductive performance of the electrical connection column 120.

Figure 7:
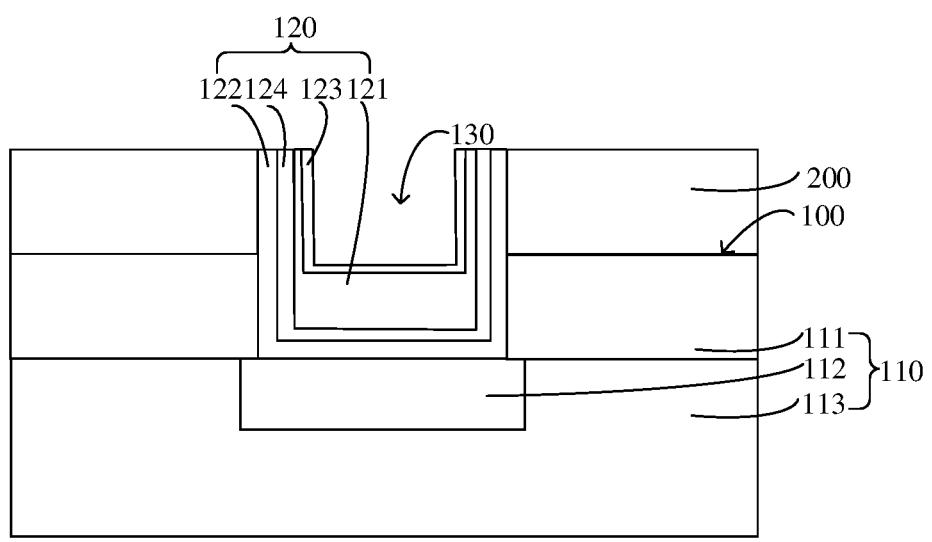

Referring to FIG. 7, a first metal protective layer 123 is formed on the bottom face and sidewalls of the groove at the top of the conductive body 121, and the remaining groove serves as the first groove 130.

In some embodiments, the first metal protective layer 123 may be flush with the top face of the first diffusion barrier layer 122, and the thickness of the first metal protective layer 123 may be 5 nm to 50 nm.

It will be appreciated that when the thickness of the first metal protective layer 123 is less than 5 nm, the effect of protecting the conductive body 121 is not good. When the thickness of the first metal protective layer 123 is greater than 50 nm, the volume of an initial welding structure to be formed subsequently is affected. The volume of the initial welding structure is related to a limiting space defined by the first metal protective layer 123. As the first metal protective layer 123 is thicker, the limiting space defined by the first metal protective layer 123 is smaller accordingly, and the volume for accommodating the initial welding structure is smaller accordingly.

The corresponding thickness of the first metal protective layer 123 may be selected according to practical situations.

Figure 8:
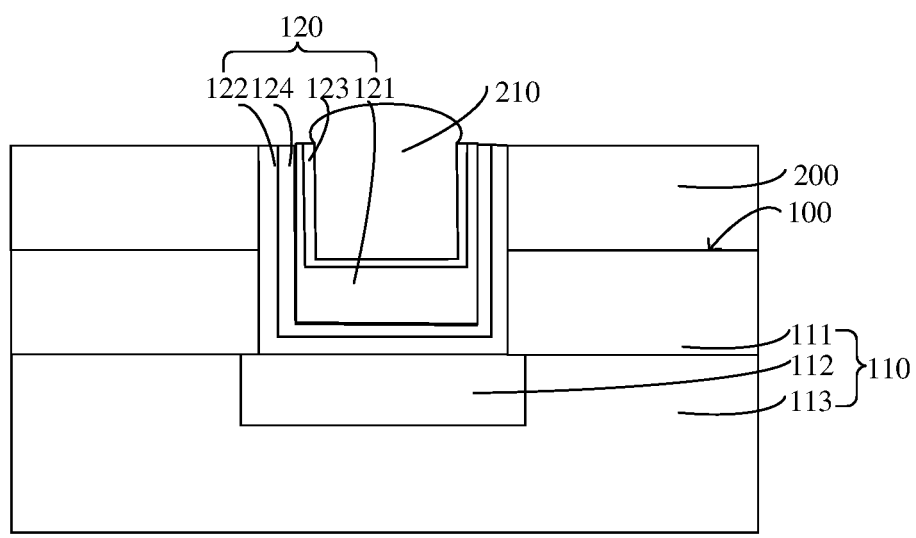

Referring to FIG. 8, in some embodiments, an initial welding structure 210 filling the first groove 130 (referring to FIG. 7) is also formed after the first metal protective layer 123 is formed.

The initial welding structure 210 provides a process basis for subsequent connection of the conductive column 160 and the electrical connection column 120.

In some embodiments, the material of the initial welding structure 210 may be tin or tin-silver alloy. The speed at which the initial welding structure 210 is formed is high due to lower melting point and solidification point of the tin or the tin-silver alloy. The limiting space formed by the first metal protective layer 123 may also limit the shape of the initial welding structure 210, and may prevent the initial welding structure 210 in a molten state from flowing to the surroundings during the process of forming the initial welding structure 210. The probability that adjacent conductive columns 160 or adjacent electrical connection columns 120 of the semiconductor structure are electrically connected due to the flow of the initial welding structure 210 can be reduced, thereby reducing the risk of short-circuiting the semiconductor structure.

In some embodiments, the initial welding structure 210 may become a solid state by means of condensation after filling the initial welding structure 210 in a molten state into the remaining space of the groove.

In some embodiments, the top face of the initial welding structure 210 may be higher than the top face of the first metal protective layer 123. In other embodiments, the top face of the initial welding structure 210 may also be flush with the top face of the first metal protective layer 123. In still other embodiments, the top face of the initial welding structure 210 may also be lower than the first metal protective layer 123. It will be appreciated that when the first base 110 and the second base 150 are subsequently bonded, the conductive column exposed by the second groove is arranged in the first groove 130 (referring to FIG. 7), and occupies a portion of an accommodation space of the first groove 130 (referring to FIG. 7). Thus, the top face of the initial welding structure 210 may also be lower than the first metal protective layer 123. The volume of the initial welding structure 210 can be adjusted according to practical requirements.

It will be appreciated that the portion of the initial welding structure 210 higher than the top face of the first metal protective layer 123 is in the shape of a circular arc due to the existence of the surface tension of liquid. Moreover, since the initial welding structure 210 is easily formed by solidification due to a high condensation point, it is relatively easy to make the top face of the initial welding structure 210 higher than the top face of the first metal protective layer 123.

Figure 9:
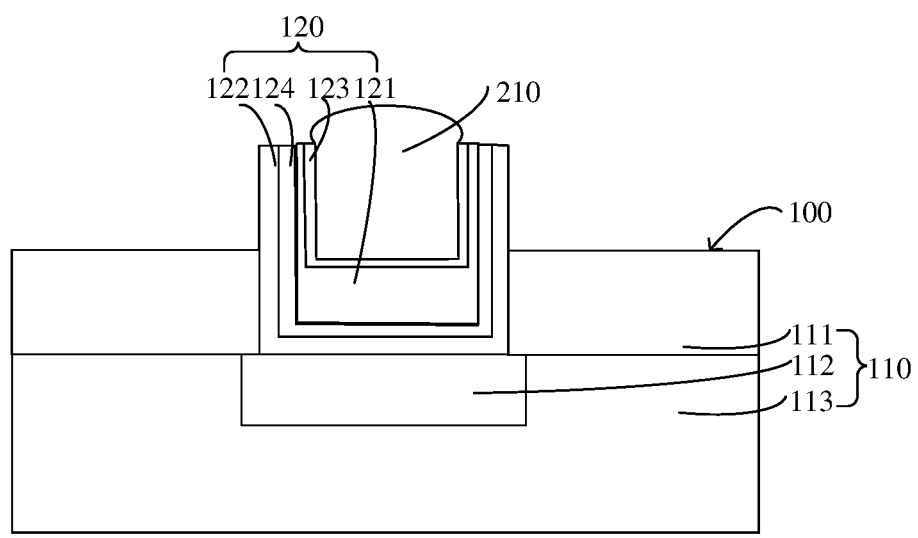

Referring to FIG. 9, after the initial welding structure 210 is formed, the method further includes the following operation. The mask layer 200 (referring to FIG. 8) is removed.

Figure 10:
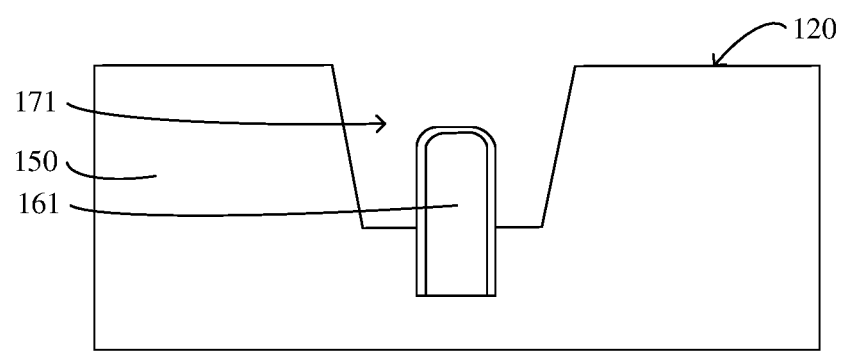
Figure 11:
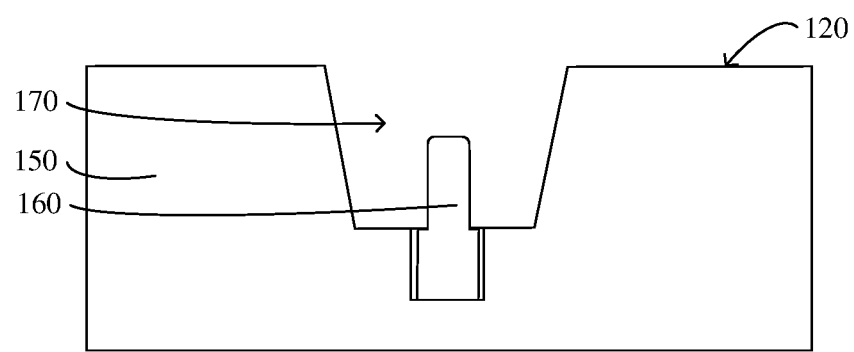

Referring to FIGS. 10 and 11, a second base 150 having a second face 140 is provided. A conductive column 160 is provided in the second base 150, and the second base 150 also has a second groove 170. A top face and at least a portion of a side face of the conductive column 160 are exposed by the second groove 170.

Specifically, the method for forming the second groove 170 includes the following operations. Referring to FIG. 10, the second base 150 is patterned to form a second initial groove 171 recessed from the second face 140 of the second base 150 into the second base 150. A top face and a portion of a sidewall of an initial conductive column 161 are exposed by the second initial groove 171. Referring to FIG. 11, a portion in width of the initial conductive column 161 is removed at least in a direction perpendicular to extension of the second initial groove 171 to form the second groove 170, and the remaining initial conductive column 161 (referring to FIG. 10) serves as the conductive column 160.

In some embodiments, the second initial groove 171 may be formed by dry etching. The initial conductive column 161 may be etched with a mixed solution of hydrogen peroxide and ammonia to form the second groove 170 and the conductive column 160. The surface of the conductive column 160 may also be cleaned with a hydrogen ion-containing gas after forming the conductive column 160.

Referring to FIGS. 10 and 11 again, the second base 150 having the second groove 170 and the conductive column 160 and the first base 110 (referring to FIG. 9) having the first groove 130 (referring to FIG. 7) and the electrical connection column 120 (referring to FIG. 9) may be engaged with each other by removing a portion in width of the initial conductive column 161 exposed by the second initial groove 171. Thus, a space is reserved for the thermal expansion of the portions of the conductive column 160 and the electrical connection column 120 (referring to FIG. 9) when bonding the first base 110 (referring to FIG. 9) to the second base 150 subsequently, avoiding direct contact between the conductive column 160 and the electrical connection column 120, thereby avoiding mutual extrusion between the conductive column 160 and the electrical connection column 120 due to thermal expansion of the conductive column 160 and the electrical connection column 120 during the bonding process. By reserving a space for the thermal expansion of the portions of the conductive column 160 and the electrical connection column 120, the internal stress exerted to the conductive column 160 and the electrical connection column 120 can be reduced. By reserving the space for thermal expansion between the conductive column 160 and the electrical connection column 120, the conductive column 160 and the electrical connection column 120 can be connected more tightly after thermal expansion. Accordingly, the space volume of the second groove 170 can be increased, so that more welding structures 180 can be accommodated, thereby improving the tightness of connection between the first base 110 and the second base 150.

In some embodiments, the width of the second groove 170 formed is 2 to 3 times the width of the conductive column 160 exposed by the second groove 170 in a direction perpendicular to extension of the conductive column 160.

The width of the second groove 170 is set to be 2 to 3 times the width of the conductive column 160 exposed by the second groove 170, thereby facilitating filling of the unoccupied space in the second groove 170 by the conductive column 160 and the electrical connection column 120. It will be appreciated that a width ratio of the second groove 170 to the conductive column 160 can be adjusted accordingly according to the total volume of the conductive column 160 and the electrical connection column 120 to be accommodated in the first groove 130 and the second groove 170.

A depth ratio of the first groove 130 to the second groove 170 formed is within a range of 1:1 to 1:5 in a direction perpendicular to the first face 100 or perpendicular to the second face 140. For example, the depth ratio is 1:2, 1:3.2, or 1:4, etc.

It will be appreciated that the depth ratio of the first groove 130 to the second groove 170 may be adjusted according to actual requirements. A depth sum of the first groove 130 and the second groove 170 needs to satisfy that the welding structure 180 fills up the first groove 130 and the second groove 170 after bonding the first base 110 to the second base 150. On the premise of satisfying that the welding structure 180 fills up the first groove 130 and the second groove 170, as the depth of the second groove 170 is larger, the contact area between the electrical connection column 120 and the conductive column 160 is larger accordingly. As the contact area is larger, the heat dissipation effect of the semiconductor structure is better. When the depth ratio of the first groove 130 to the second groove 170 is less than 1:10, it may occur that the welding structure 180 cannot fill up the whole first groove 130 and second groove 170, resulting in poor stability of the semiconductor structure.

Referring to FIGS. 10 and 11 again, in some embodiments, the conductive column 160 further includes a silicon oxide layer on its surface. The process of forming by etching the first groove 130 and the second groove 170 further includes the following operation. The silicon oxide layer on the surface of the conductive column 160 exposed by the first groove 130 and the second groove 170 is removed.

In some embodiments, the method for removing the silicon oxide layer may be that: the silicon oxide layer on the surface of the conductive column 160 exposed by the first groove 130 and the second groove 170 is etched by using a hydrofluoric acid.

Figure 12:
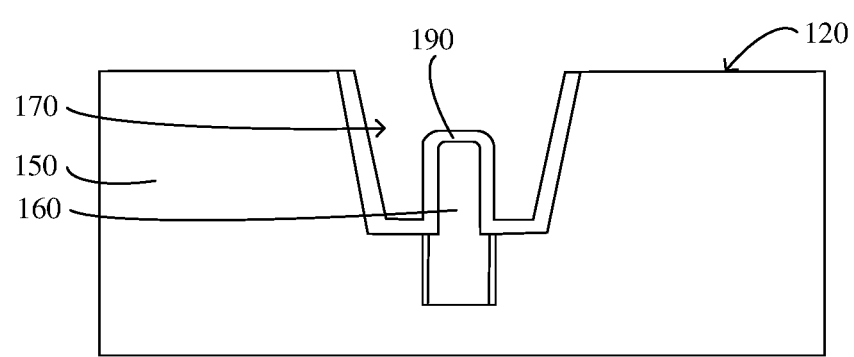

Referring to FIG. 12, in some embodiments, before the second face 140 is bonded to the first face 100, the method further includes the following operation. A second diffusion barrier layer 190 is formed. The second diffusion barrier layer 190 is located on a bottom face and sidewalls of the second groove 170, and also located on a top face and side faces of the conductive column 160 exposed by the second groove 170.

In some embodiments, a second diffusion barrier layer 190 may be formed on the surface of the second groove 170 by electroplating. In other embodiments, a second diffusion barrier layer may be formed by PVD. A second initial barrier layer may be formed on the surface of the second base 150, and the sidewalls and bottom faces of the first groove 130 and the second groove 170. A second pattern layer is formed. The second pattern layer exposes the second initial barrier layer located on the surface of the second base 150. The second initial barrier layer located on the surface of the second base 150 is removed by etching with the second pattern layer as a mask, and the remaining second initial barrier layer serves as a second diffusion barrier layer 190. The second pattern layer is removed.

By arranging the second diffusion barrier layer 190, it is possible to prevent a portion of ions of the material of the conductive column 160 from entering the first base 110 when the ions are diffused, thereby reducing the possibility of contaminating the first base 110, and thus improving the performance of the semiconductor structure. By arranging the second diffusion barrier layer 190, it is possible to fill grain boundaries and various defects of a portion of the conductive column 160, thereby blocking a fast diffusion path of atoms.

In some embodiments, a second electroplating seed layer may also be formed on the bottom face and sidewalls of the second groove prior to forming the second diffusion barrier layer. By means of the second electroplating seed layer, adhesion between the conductive column and the subsequently formed second diffusion barrier layer can be improved.

Figure 13:
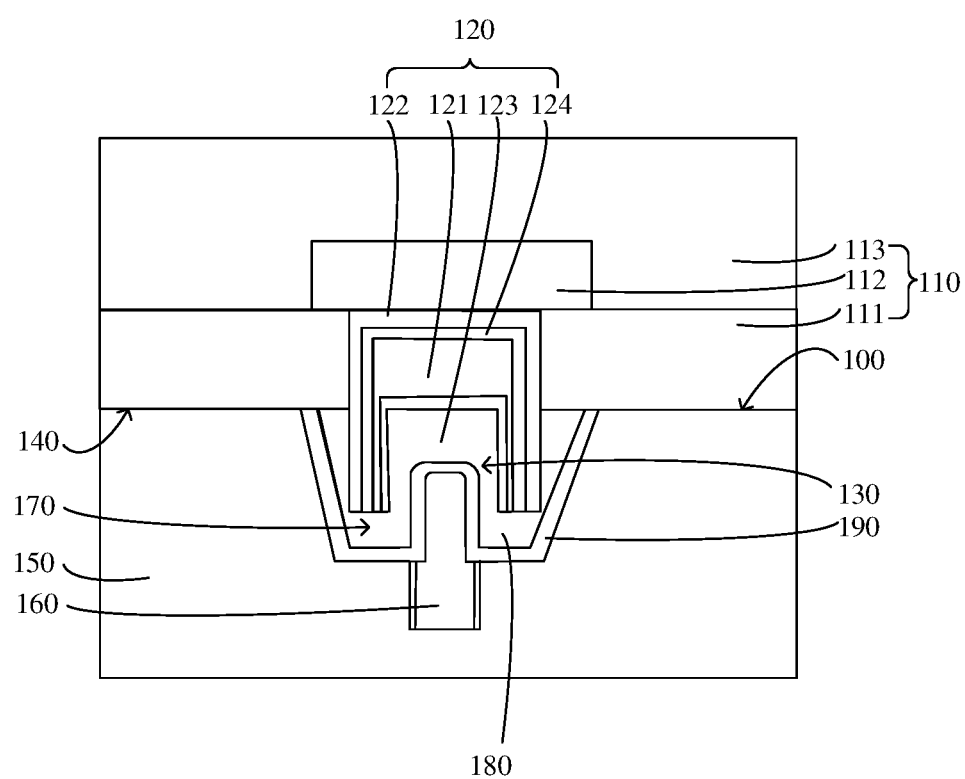

Referring to FIG. 13, the second face 140 is bonded to the first face 100. The electrical connection column 120 is partially located in the second groove 170, the conductive column 160 is partially located in the first groove 130, and at least a portion of the conductive column 160 overlaps a portion of the electrical connection column 120 in a staggered manner A welding structure 180 is formed. At least a portion of the welding structure 180 is filled in the second groove 170, and at least a further portion of the welding structure 180 is filled between the conductive column 160 and the first groove 130.

The initial welding structure 210 (referring to FIG. 9) is annealed during the process of bonding the second face 140 to the first face 100 to form the welding structure 180. It will be appreciated that during the process of bonding the second face 140 to the first face 100, the initial welding structure 210 (referring to FIG. 9) is heated to become molten. As the surfaces of the second face 140 and the first face 100 are attached, the initial welding structure 210 (referring to FIG. 9) in the molten state is limited by the first groove 130 and the second groove 170 and pressed by the electrical connection column 120, so that the initial welding structure 210 (referring to FIG. 9) in the molten state moves away from the electrical connection column 120. After completing the bonding of the second face 140 to the first face 100, the semiconductor structure is annealed, so that the initial welding structure 210 (referring to FIG. 9) in the molten state may be condensed into the welding structure 180.

The electrical connection of the conductive column 160 and the electrical connection column 120 can be achieved by the welding structure 180, and the connection between the first base 110 and the second base 150 can be reinforced by the welding structure 180, thereby improving the stability of the semiconductor structure.

Embodiments of the disclosure provide a method for manufacturing a semiconductor structure. By arranging an electrical connection column 120 in a second groove 170 and arranging a conductive column 160 in a first groove 130, the conductive column 160 and the electrical connection column 120 may overlap in a staggered manner, so as to advantageously prevent a first base 110 and a second base 150 from sliding mutually, thereby improving the stability of bonding between the first base 110 and the second base 150. The conductive column 160 is arranged in the first groove 130. The conductive column 160 and the electrical connection column 120 are thermally expanded during the process of bonding the first base 110 to the second base 150, so that the conductive column 160 and the electrical connection column 120 are engaged with each other, thereby improving the tightness of connection between the first base 110 and the second base 150. The height of the whole semiconductor structure can be reduced by arranging the electrical connection column 120 in the second groove 170 and arranging the conductive column 160 in the first groove 130. While the connection between the electrical connection column 120 and the conductive column 160 is realized by a welding structure 180, the contact area between the electrical connection column 120 and the conductive column 160 can be increased, so that the heat dissipation of the whole semiconductor structure can be improved. Moreover, the contact area between the first base 110 and the second base 150 can be increased by increasing the contact area between the electrical connection column 120 and the conductive column 160, thereby reducing the contact resistance between the first base 110 and the second base 150, and thus improving the performance of the semiconductor structure.

It will be appreciated by those of ordinary skill in the art that the above-described implementations are specific embodiments for implementing the disclosure. Various changes in form and details may be made in practical applications without departing from the spirit and scope of the embodiments of the disclosure. Various changes and modifications may be made by one skilled in the art without departing from the spirit and scope of the embodiments of the disclosure. Therefore, the protection scope of the embodiments of the disclosure should be subject to the scope defined by the claims.

The invention claimed is:

1. A semiconductor structure, comprising:
a first base having a first face, wherein the first base has an electrical connection column protruding from the first face, and a first groove is provided at a top of the electrical connection column;
a second base having a second face, wherein a conductive column is provided in the second base, and the second base also has a second groove, and wherein a top face and at least a portion of a side face of the conductive column are exposed by the second groove, the second face being bonded to the first face, the electrical connection column being partially located in the second groove, and the conductive column being partially located in the first groove; and a welding structure, wherein at least a portion of the welding structure is filled in the second groove, and at least a further portion of the welding structure is filled between the conductive column and the first groove.

2. The semiconductor structure according to claim 1, wherein a cross-section of a portion of the conductive column exposed by the second groove is smaller than a cross-section of a portion of the conductive column not exposed by the second groove, in a plane parallel to the second face.

3. The semiconductor structure according to claim 1, wherein the electrical connection column comprises: a conductive body, a first diffusion barrier layer located on a bottom face and side faces of the conductive body, and a first metal protective layer located on sidewalls and a bottom face of the first groove, the conductive body being partially located in the second groove.

4. The semiconductor structure according to claim 3, wherein a material of the conductive body comprises copper or aluminum, and a material of the first diffusion barrier layer comprises tantalum, titanium, titanium nitride, or tantalum nitride.

5. The semiconductor structure according to claim 3, wherein the electrical connection column further comprises: a first electroplating seed layer located between the conductive body and the first diffusion barrier layer.

6. The semiconductor structure according to claim 1, wherein a depth ratio of the first groove to the second groove is within a range of 1:1 to 1:5 in a direction perpendicular to the first face or perpendicular to the second face.

7. The semiconductor structure according to claim 1, wherein the welding structure is also located between the electrical connection column and sidewalls of the second groove.

8. The semiconductor structure according to claim 1, wherein a material of the welding structure comprises tin or tin-silver alloy.

9. The semiconductor structure according to claim 1, further comprising: a second diffusion barrier layer located on a bottom face and sidewalls of the second groove, and also located on the top face and side faces of the conductive column exposed by the second groove.

10. The semiconductor structure according to claim 1, wherein a width of the second groove is 2 to 3 times a width of a portion of the conductive column not exposed by the second groove, in a direction parallel to the second face.

11. A method for manufacturing a semiconductor structure, comprising:

providing a first base having a first face, wherein the first base has an electrical connection column protruding from the first face, and a first groove is provided at a top of the electrical connection column;

providing a second base having a second face, wherein a conductive column is provided in the second base, and the second base also has a second groove, and wherein a top face and at least a portion of a side face of the conductive column are exposed by the second groove;

bonding the second face to the first face, wherein the electrical connection column is partially located in the second groove, the conductive column is partially located in the first groove, and at least a portion of the conductive column overlaps a portion of the electrical connection column in a staggered manner; and forming a welding structure, wherein at least a portion of the welding structure is filled in the second groove, and at least a further portion of the welding structure is filled between the conductive column and the first groove.

12. The method for manufacturing a semiconductor structure according to claim 11, wherein a method for forming the electrical connection column comprises:

forming a first diffusion barrier layer;

forming a conductive body located on a top face of the first diffusion barrier layer and sidewalls of the first diffusion barrier layer; and forming a first metal protective layer located between the welding structure in the second groove and the conductive body.

13. The method for manufacturing a semiconductor structure according to claim 12, further comprising: before forming the conductive body, forming a first electroplating seed layer located between the conductive body and the first diffusion barrier layer.

14. The method for manufacturing a semiconductor structure according to claim 11, wherein a method for forming the second groove comprises:

patterning the second base to form a second initial groove recessed from the second face of the second base into the second base, a top face and a portion of a sidewall of an initial conductive column being exposed by the second initial groove; and removing a portion in width of the initial conductive column at least in a direction perpendicular to extension of the second initial groove to form the second groove, remaining initial conductive column serving as the conductive column.

15. The method for manufacturing a semiconductor structure according to claim 14, wherein a width of the second groove formed is 2 to 3 times a width of the conductive column exposed by the second groove, in a direction perpendicular to extension of the conductive column.

16. The method for manufacturing a semiconductor structure according to claim 11, wherein a depth ratio of the first groove to the second groove formed is within a range of 1:1 to 1:5 in a direction perpendicular to the first face or perpendicular to the second face.

17. The method for manufacturing a semiconductor structure according to claim 11, further comprising: before bonding the second face to the first face, forming a second diffusion barrier layer located on a bottom face and sidewalls of the second groove, and also located on the top face and side faces of the conductive column exposed by the second groove.

18. The method for manufacturing a semiconductor structure according to claim 11, wherein forming the welding structure comprises:

forming an initial welding structure located in the first groove; and annealing the initial welding structure during bonding the second face to the first face to form the welding structure.

* * * * *